(12) United States Patent
Ishimaru

(10) Patent No.: US 10,032,714 B2
(45) Date of Patent: Jul. 24, 2018

(54) SEMICONDUCTOR SWITCH

(71) Applicant: KABUSHIKI KAISHA TOSHIBA, Tokyo (JP)

(72) Inventor: Atsushi Ishimaru, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,524

(22) Filed: Mar. 3, 2016

(65) Prior Publication Data

US 2017/0005651 A1 Jan. 5, 2017

(30) Foreign Application Priority Data

Jul. 3, 2015 (JP) .................................. 2015-134768

(51) Int. Cl.
| | | |
|---|---|---|
| *H01L 21/70* | (2006.01) | |
| *H01L 23/522* | (2006.01) | |
| *H01L 27/12* | (2006.01) | |
| *H01L 29/06* | (2006.01) | |
| *H01L 23/528* | (2006.01) | |
| *H01L 23/532* | (2006.01) | |
| *H01L 23/66* | (2006.01) | |
| *H03K 17/693* | (2006.01) | |

(52) U.S. Cl.
CPC ........ *H01L 23/5226* (2013.01); *H01L 23/528* (2013.01); *H01L 23/53214* (2013.01); *H01L 23/53228* (2013.01); *H01L 23/53261* (2013.01); *H01L 23/66* (2013.01); *H01L 27/1203* (2013.01); *H01L 29/0649* (2013.01); *H03K 17/693* (2013.01); *H01L 2223/6611* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 8,134,224 B2 | 3/2012 | Sagae et al. | |
| 2008/0308837 A1* | 12/2008 | Gauthier, Jr. | ....... H01L 27/0262 257/107 |
| 2011/0079851 A1* | 4/2011 | Li | .......................... H01L 21/74 257/347 |

(Continued)

FOREIGN PATENT DOCUMENTS

| | | |
|---|---|---|
| JP | H08316420 A | 11/1996 |
| JP | 2008227084 A | 9/2008 |
| JP | 2014135419 A | 7/2014 |

*Primary Examiner* — Calvin Choi
(74) *Attorney, Agent, or Firm* — Patterson & Sheridan, LLP

(57) ABSTRACT

A semiconductor switch includes an insulating film on a semiconductor substrate. A switching circuit is on a first portion of the insulating film. The switching circuit is configured to switch a path of a high-frequency signal. A wiring layer is provided on the insulating film. The wiring layering includes a signal wire and a ground wire. A conductive layer is between the wiring layer and the insulating film. The conductive layer, in some embodiments, includes a first conductive region between the high-frequency wiring and the insulating film and a second conductive region between the grounding wiring and the insulating film.

19 Claims, 15 Drawing Sheets

(56) References Cited

U.S. PATENT DOCUMENTS

| | | | |
|---|---|---|---|
| 2013/0140156 A1* | 6/2013 | Fujii | H01L 41/0838 200/181 |
| 2015/0262910 A1* | 9/2015 | Sun | H01L 23/481 327/306 |
| 2015/0263721 A1* | 9/2015 | Ishimaru | H03K 17/693 327/382 |
| 2016/0190231 A1 | 6/2016 | Ishimaru et al. | |

* cited by examiner

SEMICONDUCTOR SWITCH

CROSS-REFERENCE TO RELATED APPLICATION

This application is based upon and claims the benefit of priority from Japanese Patent Application No. 2015-134768, filed Jul. 3, 2015, the entire contents of which are incorporated herein by reference.

FIELD

Embodiments described herein relate generally to semiconductor switches.

BACKGROUND

In a mobile communication device and the like, a high-frequency switch for switching a high-frequency terminal to an antenna for transmission or to an antenna for reception is used. As the high-frequency switch, a semiconductor switch having an insulated gate field-effect transistor (a MOS transistor) can be used.

Providing the semiconductor switch on a silicon-on-insulator (SOI) substrate in which a semiconductor layer is provided on an insulating film over a semiconductor substrate is effective because the use of a high-resistance semiconductor substrate reduces the parasitic capacitance between a high-frequency circuit and the semiconductor substrate and may improve operating speed of the semiconductor switch.

However, harmonic distortions sometimes occur in the semiconductor switch provided on a SOI substrate due to the high-frequency signal.

DETAILED DESCRIPTION

An example embodiment provides a semiconductor switch having reduced harmonic distortion.

In general, according to one embodiment, a semiconductor switch, includes an insulating film on a semiconductor substrate; an insulating film on the semiconductor layer; a conductive layer on the insulating film; a wiring layer including a first wire (e.g., a signal wire) and a second wire (e.g., a ground wire) above the conductive layer; and a switching circuit on a first portion of the insulating film. The insulating film and the semiconductor substrate can be parts of a silicon-on-insulator (SOI) type substrate. The switching circuit is configured to switch a path of a high-frequency signal, such as, for example, in a high-frequency RF transceiver application.

In some embodiments, the semiconductor switch can include a wiring layer on a second portion of the insulating film. The second portion, in this case, is adjacent to the first portion of the insulating film. The wiring layer can include a wire (a high-frequency signal line) for carrying the high-frequency signal and a ground wire that is electrically connected to the switching circuit. The conductive layer, in this case, would be disposed between the wiring layer and the second portion of the insulating film.

In some embodiments, the conductive layer improves isolation between the wiring layer and the semiconductor substrate and may function to suppress harmonic distortions in an operation of high-frequency signal transmission.

Hereinafter, embodiments are described with reference to the drawings; however, the scope of the present disclosure is not limited to the specific example embodiments described below.

First Embodiment

Figure 1:
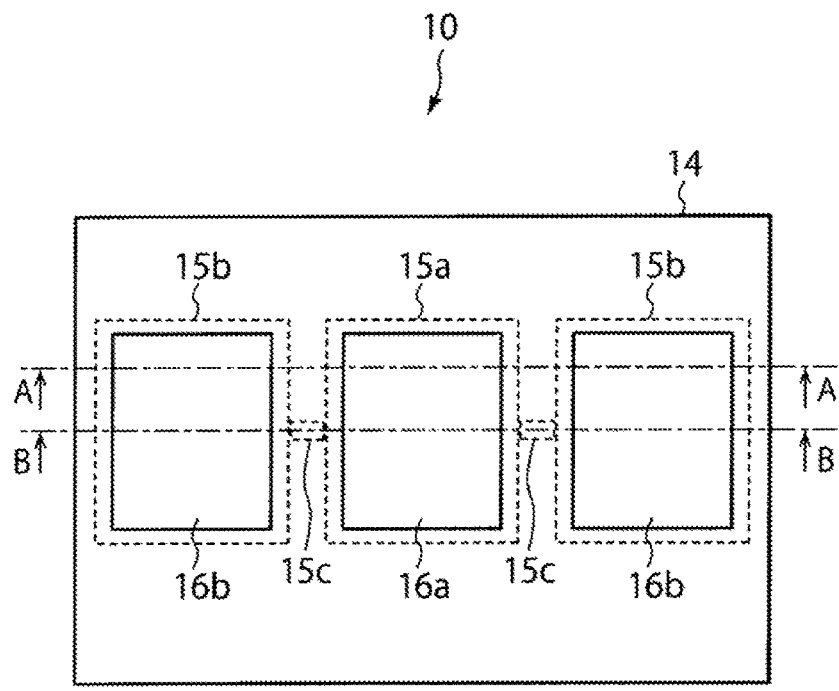
FIG. 1 is a plan view depicting a semiconductor switch according to a first embodiment.
Figure 2A:
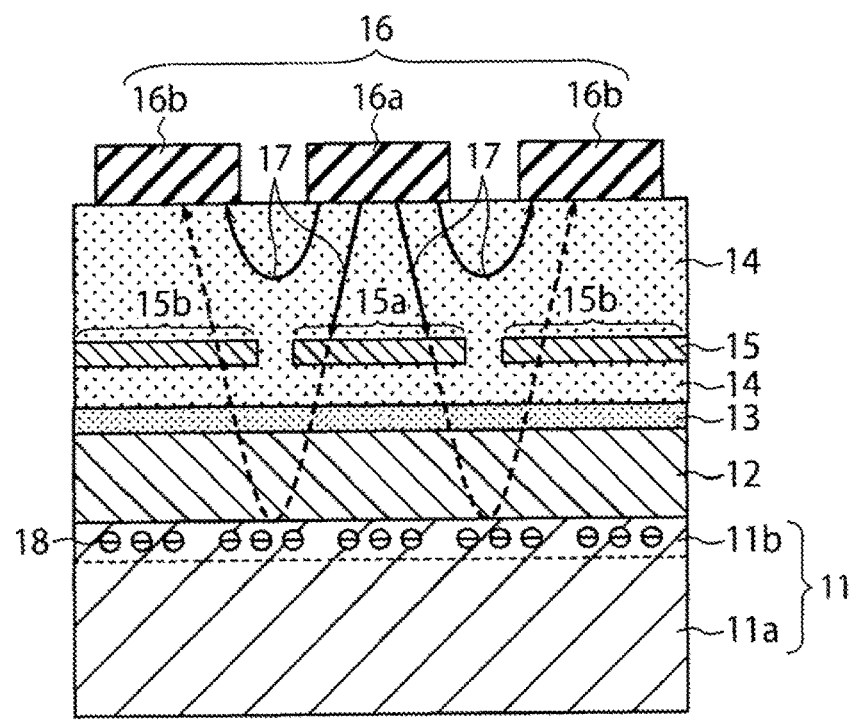
FIG. 2A is a cross-sectional view taken at line A-A in FIG. 1.

First, the concept of a semiconductor switch according to a first embodiment is described. FIG. 1 is a plan view depicting the concept of the semiconductor switch according to the first embodiment. FIG. 2A is a cross-sectional view taken at line A-A in FIG. 1, and FIG. 2B is a cross-sectional view taken at line B-B in FIG. 1.

Figure 2B:
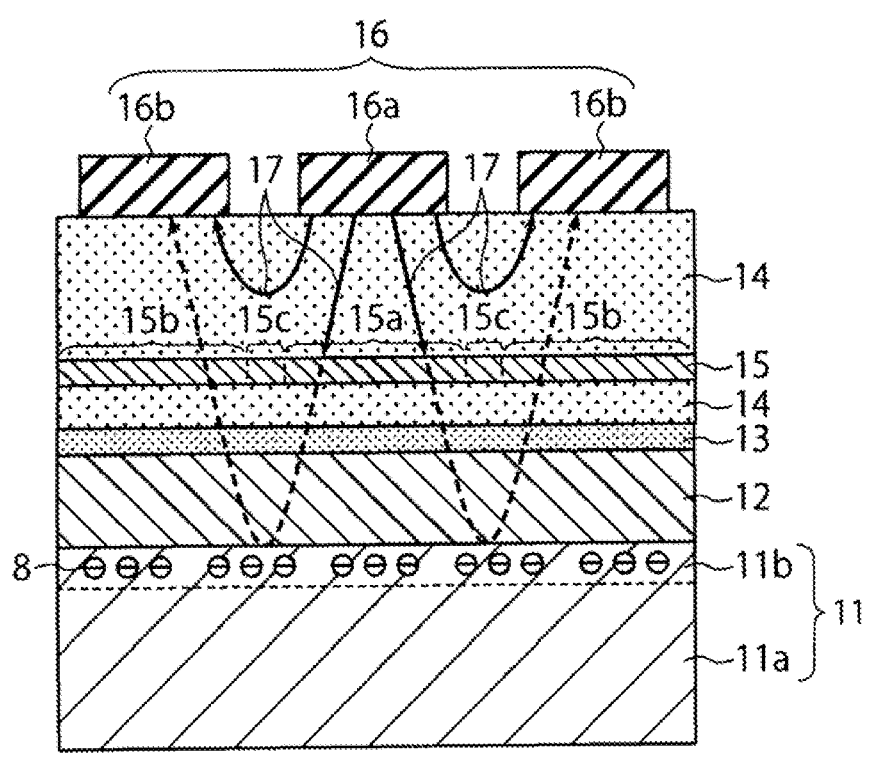
FIG. 2B is a cross-sectional view taken at line B-B in FIG. 1.

As depicted in FIGS. 2A and 2B, a semiconductor switch 10 according to the first embodiment includes a semiconductor substrate 11, an insulating film 12, a shallow trench isolation (STI) layer 13, an interlayer dielectric 14, a conductive layer 15, and a wiring layer 16.

The semiconductor substrate 11 includes a first layer 11a and a second layer 11b. The second layer 11b has a higher impurity concentration than the first layer 11a and a higher acceptor concentration than the first layer 11a. On the second layer 11b, the insulating film 12 is formed. On the insulating film 12, the shallow trench isolation (STI) layer 13 is formed.

The conductive layer 15 is formed above the STI layer 13, and is covered with the interlayer dielectric 14. The conductive layer 15 may be a metal layer that is formed of metal such as aluminum or copper or may be a silicide layer formed of a compound including silicon and a high-melting point metal such as tungsten (W) or molybdenum (Mo). The conductive layer 15 includes a first conductive region 15a, a second conductive region 15b, and a third conductive region 15c. As depicted in FIG. 1, conductive regions include the first conductive region 15a, the second conductive region 15b, and the third conductive region 15c. The first conductive region 15a is partly connected to the second conductive region 15b via the third conductive region 15c. That is, the first conductive region 15a, the second conductive region 15b, and the third conductive region 15c are electrically connected to one another. The third conductive region 15c is between the first conductive region 15a and the second conductive region 15b On the interlayer dielectric 14, the wiring layer 16 is formed. The high-frequency wiring layer 16 includes a high-frequency wiring 16a which transmits (carries) a high-frequency signal to a switch circuit (not depicted in the drawing) and a grounding wiring 16b which grounds the switch circuit.

In the semiconductor switch 10 configured as described above, when a high-frequency signal passes through the high-frequency wiring 16a electric flux lines 17 are conceptually formed as depicted in FIGS. 2A and 2B (solid line portions of electric flux lines 17). When the conductive layer 15 is not provided in a semiconductor switch, electric flux lines 17 will couple to the grounding wiring 16b via the interface between the semiconductor substrate 11 and the insulating film 12. This coupling in the absence of conductive layer 15 is represented by dotted line portions of electric flux lines 17 depicted in FIGS. 2A and 2B. Because charges (electrons) 18 accumulated near the interface between the semiconductor substrate 11 and the insulating film 12 move as a result of being accelerated by the electric flux represented by electric flux lines 17, harmonic distortion occurs in the high-frequency signal.

However, as in the semiconductor switch 10 according to this first embodiment, when the conductive layer 15 is formed between the wiring layer 16 and the insulating film 12, the effect of the electric flux (electric flux lines 17) can be blocked by the presence of conductive layer 15. As a result, the occurrence of harmonic distortion caused by the movement of the charges 18 is reduced.

Figure 3:
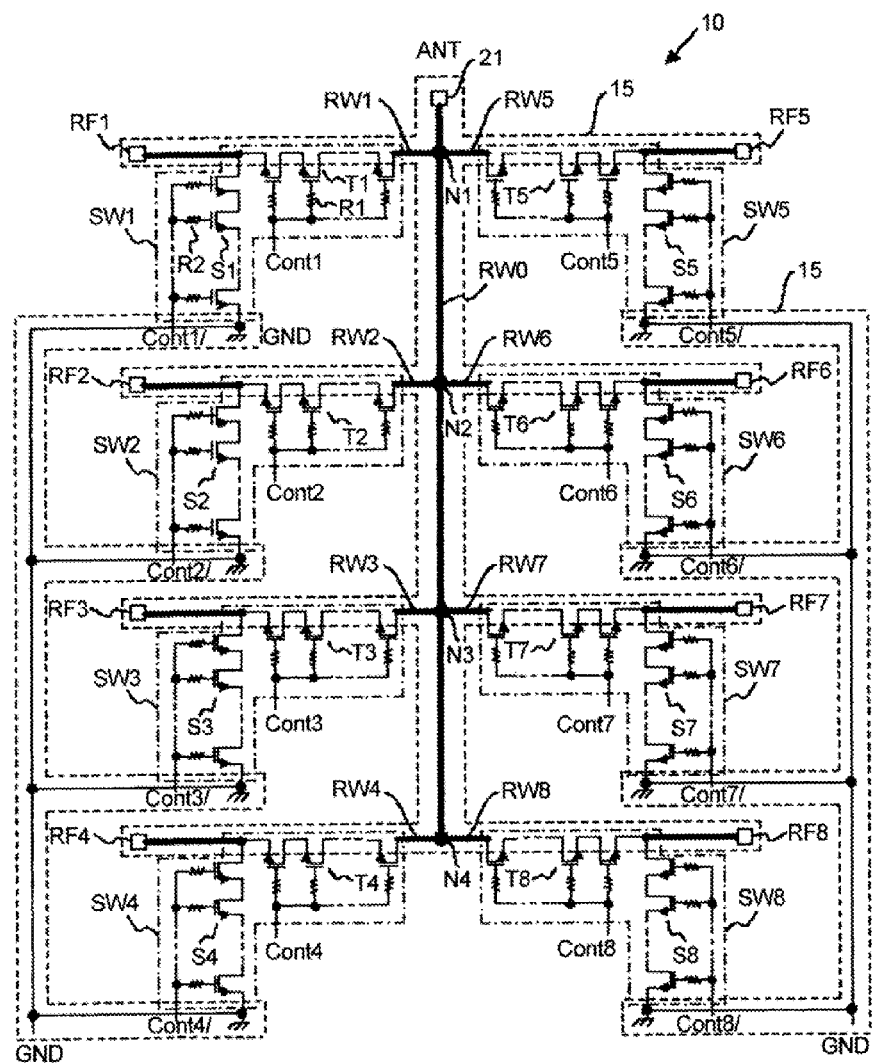
FIG. 3 is a circuit diagram of the semiconductor switch according to the first embodiment.

Next, the overall configuration of the semiconductor switch 10 according to this first embodiment is described. FIG. 3 is a circuit diagram of the semiconductor switch 10 according to the first embodiment. Here, the semiconductor switch 10 is, for example, a high-frequency switch which switches a high-frequency terminal to an antenna for transmission or the antenna to the high-frequency terminal for reception in a mobile communication device and the like.

As depicted in FIG. 3, switch circuits SW1 to SW8 and high-frequency wirings RW0 to RW8 are provided in the semiconductor switch 10.

The switch circuits SW1 to SW8 are individually provided between an antenna terminal (a common terminal) 21 and high-frequency terminals (individual terminals) RF1 to RF8. The switch circuits SW1 to SW8 are connected to the antenna terminal 21 and the high-frequency terminals RF1 to RF8, respectively, by the high-frequency wirings RW0 to RW8. Hereinafter, the switch circuit SW1 is described but, in general, the same description is applicable to the other switch circuits SW2 to SW8.

The switch circuit SW1 includes a plurality of N-type MOS transistors (hereinafter referred to as "through transistors") T1 connected in series between a node N1 and the high-frequency terminal RF1 and a plurality of N-type MOS transistors (hereinafter referred to as "shunt transistors") S1 connected in series between the high-frequency terminal RF1 and a grounding terminal GND.

Connected to a gate terminal of each through transistor T1 is a resistor R1 for stabilizing a switching operation (such as prevention of oscillation). The resistor R1 has a resistance value which is high enough to prevent leakage of a high-frequency signal to a bias/control circuit 22 (see FIG. 4). Also connected to a gate terminal of each shunt transistor S1, is a resistor R2 for preventing leakage of a high-frequency signal. The values of the resistors R1 and R2 are 100 kΩ or more, for example.

Applied to the gate terminal of each through transistor T1 is a control signal Cont1. Applied to the gate terminal of each shunt transistor S1 is an inverted control signal Cont1/ obtained by inverting the control signal Cont1. Therefore, the through transistor T1 and the shunt transistor S1 are complementarily brought into or out of conduction. For example, to bring the antenna terminal 21 and the high-frequency terminal RF1 into conduction, the through transistor T1 is brought into conduction and the shunt transistor S1 is brought out of conduction. At the same time, all the through transistors T2 to T8 are brought out of conduction and all the shunt transistors S2 to S8 are brought into conduction.

The high-frequency wiring RW0 is the main high-frequency wiring extending from the antenna terminal 21 to a node N4 via nodes N1, N2, and N3 in order. The high-frequency wiring RW1 connects the node N1 and the high-frequency terminal RF1 via the switch circuit SW1. Likewise, the high-frequency wirings RW2 to RW8 connect the node N1 and the high-frequency terminals RF2 to RF8 via the switch circuits SW2 to SW8, respectively. The high-frequency wirings RW0 to RW8 transmit a high-frequency signal to the switch circuits SW1 to SW8. This high-frequency signal has, for example, a frequency of 700 MHz or more and power of 20 dBm or more, and is modulated by the Universal Mobile Telecommunication System (UMTS).

Each of the high-frequency wirings RW0 to RW8 corresponds to the high-frequency wiring 16a depicted in FIG. 1 and FIGS. 2A and 2B. Hereinafter, any one of the high-frequency wirings RW0 to RW8 is sometimes referred to as the high-frequency wiring 16a.

Figure 4:
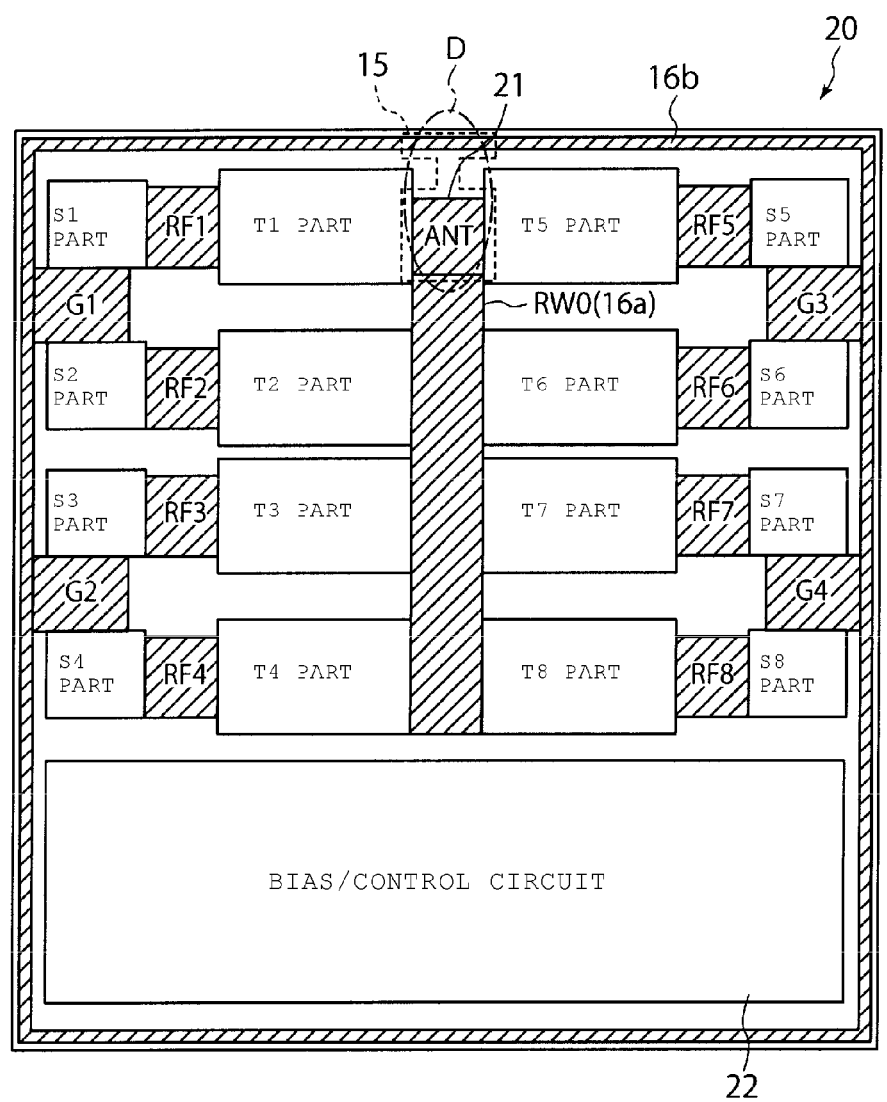
FIG. 4 is a plan view depicting layout of a semiconductor chip on which switch circuits are formed.

FIG. 4 is a plan view depicting the layout of a semiconductor chip on which the switch circuits are formed. As depicted in FIG. 4, on one side of a semiconductor chip 20, the antenna terminal 21, the high-frequency terminals RF1 to RF8, grounding terminals G1 to G4, the through transistor T1 to T8 parts, and the shunt transistor S1 to S8 parts are arranged. The sizes of the units and terminals are not limited to the sizes depicted in the drawing.

Both of the shunt transistor S1 part and the shunt transistor S2 part arranged on opposite sides of the grounding terminal G1 are connected to the grounding terminal G1. The same applies to the grounding terminals G2, G3, and G4 and therefore the explanation thereof is omitted.

On the other side of the semiconductor chip 20, a bias/control circuit 22 is arranged. The bias/control circuit 22 generates control signals Cont1 to Cont8 and inverted control signals Cont1/ to Cont8/ and controls the switch circuits SW1 to SW8.

The conductive layer 15 may be partly formed with respect to the high-frequency wiring 16a and the grounding wiring 16b as indicated by a dotted line region in FIG. 4, or may be formed all over the area as indicated by a hatched region. In the hatched region, the conductive layer 15 is formed below the high-frequency wiring RW0 and the high-frequency wirings RW1 to RW8 which are not depicted in FIG. 4. Furthermore, the conductive layer 15 is also formed below the antenna terminal 21 and the high-frequency terminals RF1 to RF8.

Moreover, the conductive layer 15 may be formed below the grounding terminals G1 to G4 or the grounding wiring 16b provided on the periphery of the semiconductor chip 20. The grounding wiring 16b may be formed so as to surround the antenna terminal 21, the high-frequency terminals RF1 to RF8, the grounding terminals G1 to G4, the through transistor T1 to T8 parts, the shunt transistor S1 to S8 parts, and the bias/control circuit 22. The grounding terminals G1 to G4 are connected to the grounding wiring 16b.

Figure 5:
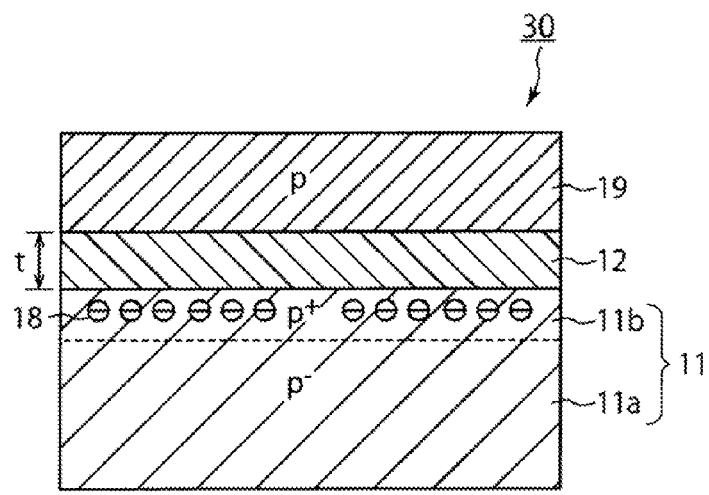
FIG. 5 is a cross-sectional view of a SOI substrate on which the switch circuits can be formed.

FIG. 5 is a cross-sectional view of a SOI substrate on which the switch circuits SW1 to SW8 are formed. As depicted in FIG. 5, a SOI substrate 30 includes the semiconductor substrate 11 which is a support substrate, the insulating film 12 formed on the semiconductor substrate 11, and a semiconductor layer 19 stacked on the insulating film 12.

In this first embodiment, the semiconductor substrate 11 is formed as a p-type silicon substrate with the first layer 11a having a first specific resistance ρ1 and the second layer 11b having a higher impurity concentration than the first layer 11a. The thickness of the second layer 11b is about 0.5 to 1 μm, for example. An impurity contained in the second layer 11b is, for example, boron (B) which is an acceptor impurity. Since acceptors generate positively charged holes, the charges (electrons) 18 accumulated near the interface between the insulating film 12 and the semiconductor substrate 11 are canceled by the holes. As a result, the charge density near the interface is reduced.

The insulating film 12 is formed as a silicon dioxide film. The thickness t (see FIG. 5) of the insulating film 12 is about 1 to 2 μm, for example. The insulating film 12 is also referred to as a buried oxide (BOX) layer.

The semiconductor layer 19 is formed as a p⁻-type silicon layer having a second specific resistance ρ2. Preferably, the second specific resistance ρ2 is lower than the first specific resistance ρ1 in order to reduce the parasitic capacitance that is generated between the semiconductor layer 19 which is an active layer and the semiconductor substrate 11. Specifically, while the first specific resistance ρ1 is 1 kΩ·cm or more, for example, the second specific resistance ρ2 is about 10 Ω·cm, for example. Moreover, the thickness of the semiconductor layer 19 is about 0.1 to 1 μm, for example. In the semiconductor layer 19, the switch circuits SW1 to SW8 are formed. The semiconductor layer 19 is also called a SOI layer.

Figure 6:
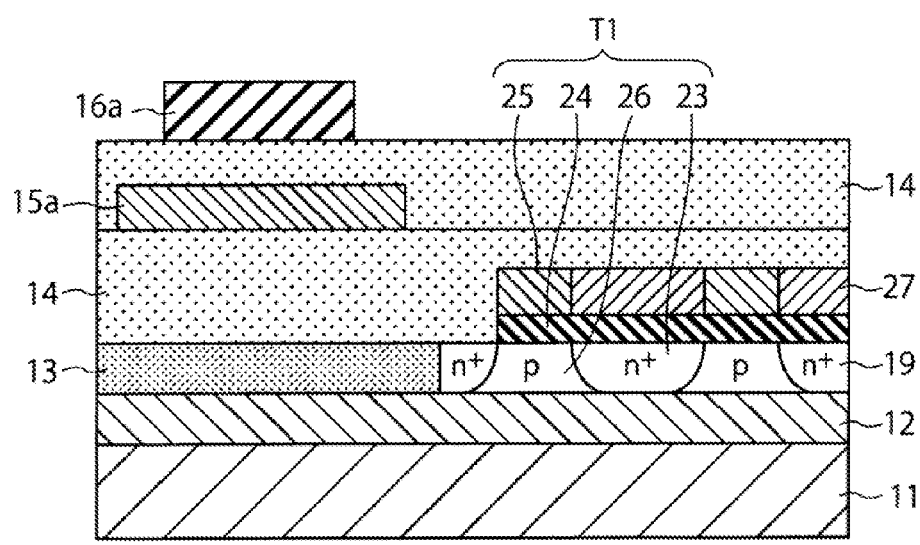
FIG. 6 is a cross-sectional view depicting a portion of the semiconductor switch according to the first embodiment.

FIG. 6 is a cross-sectional view depicting a portion of the semiconductor switch 10 according to this first embodiment. In FIG. 6, the through transistor T1 which is a component element of the switch circuit SW1 is formed in the semiconductor layer 19. The through transistor T1 has a pair of source-drain layers 23, a gate insulating film 24, a gate electrode 25, and a channel layer 26.

The pair of source-drain layers 23 is provided in a region obtained as a result of the semiconductor layer 19 being processed into a shape of an island. The gate insulating film 24 is provided between the pair of source-drain layers 23 and is provided on the semiconductor layer 19. The gate electrode 25 is provided on the gate insulating film 24. The channel layer 26 is provided under the gate insulating film 24. The plurality of through transistors T1 is connected in series so as to share the pair of source-drain layers 23.

On the gate insulating film 24, a gate wiring 27 connected to the gate electrode 25 is provided. That is, the gate electrode 25 and the gate wiring 27 are arranged in the same layer. In FIG. 6, the gate insulating film 24 and the gate wiring 27 are depicted on the pair of source-drain layers 23; in actuality, the gate insulating film 24 and the gate wiring 27 connect a plurality of gate electrodes 25 in a region outside the pair of source-drain layers 23.

The interlayer dielectric 14 is provided to cover the gate wiring 27 and the conductive layer 15. The high-frequency wiring 16a is provided above the conductive layer 15 and is provided on the interlayer dielectric 14.

A portion of the semiconductor layer 19, the portion in which the switch circuits SW1 to SW8 are not formed, is removed. Therefore, the insulating film 12 is exposed from the portion from which the semiconductor layer 19 is removed. In the portion in which the insulating film 12 is exposed, the STI layer 13 for electrically separating the pair of source-drain layers 23 is provided. The STI layer 13 is a silicon dioxide film formed by chemical vapor deposition (CVD), for example. The thickness of the STI layer 13 is 60 nm, for example, and is sufficiently thinner than the insulating film 12.

On the STI layer 13, a portion of the interlayer dielectric 14 is formed, and the conductive layer 15 having a higher carrier concentration than the semiconductor layer 19 is formed thereon. On the STI layer 13, the gate insulating film 24 is not provided. Therefore, since the insulating film 12, the STI layer 13, and the interlayer dielectric 14 may be collectively regarded as one silicon dioxide film, the conductive layer 15 formed on the interlayer dielectric 14 produces the same effect as the conductive layer 15 formed on the insulating film 12.

Here, an example of a process of producing the semiconductor switch 10 according to this first embodiment is described briefly with reference to FIGS. 5 and 6.

First, on the semiconductor layer 19, a silicon-based insulating film, which will become the gate insulating film 24 and a portion of the interlayer dielectric 14, is formed. Then, portions of the silicon-based insulating film and the semiconductor layer 19 which surround the intended locations for a pair of source-drain layers 23 and the channel layer 26 are removed so that the intended location of the pair of source-drain layers 23 and the channel layer 26 are left on the insulating film 12. Then, on the portion insulating film 12 exposed as a result of the removal of the silicon-based insulating film and the semiconductor layer 19, the STI layer 13 is formed. Next, the pair of source-drain layers 23 is formed in the semiconductor layer 19 by ion implantation performed via the silicon-based insulating film, and, on the silicon-based insulating film and the STI layer 13, a polysilicon film doped with impurities is formed as a gate wiring material film.

The gate electrode 25 is obtained by patterning the gate wiring material film on the gate insulating film 24. Similarly, the gate wiring 27 is also obtained by patterning the gate wiring material film on the gate insulating film 24. The conductive layer 15 is formed above the STI layer 13. The thickness of the conductive layer 15 is 325 nm, for example. In this embodiment, the conductive layer 15 is electrically insulated from the semiconductor substrate 11, the semiconductor layer 19, the switch circuits SW1 to SW8, and the high-frequency wirings RW0 to RW8. That is, the potential of the conductive layer 15 is a floating potential.

An upper portion of the gate wiring 27 and an upper portion of the gate electrode 25 are modified to silicide as a result of high-melting point metal, for example, tungsten (W) or molybdenum (Mo), being formed on the polysilicon film and heat treatment being performed thereon. The thickness of the silicide layer (not specifically depicted in the drawing) is about 50 nm, for example. The impurity concentration of the polysilicon film is 1E15 cm$^{-3}$ or more, for example, and the sheet resistance is 10 Ω/sq. (square □), for example.

Figure 7A:
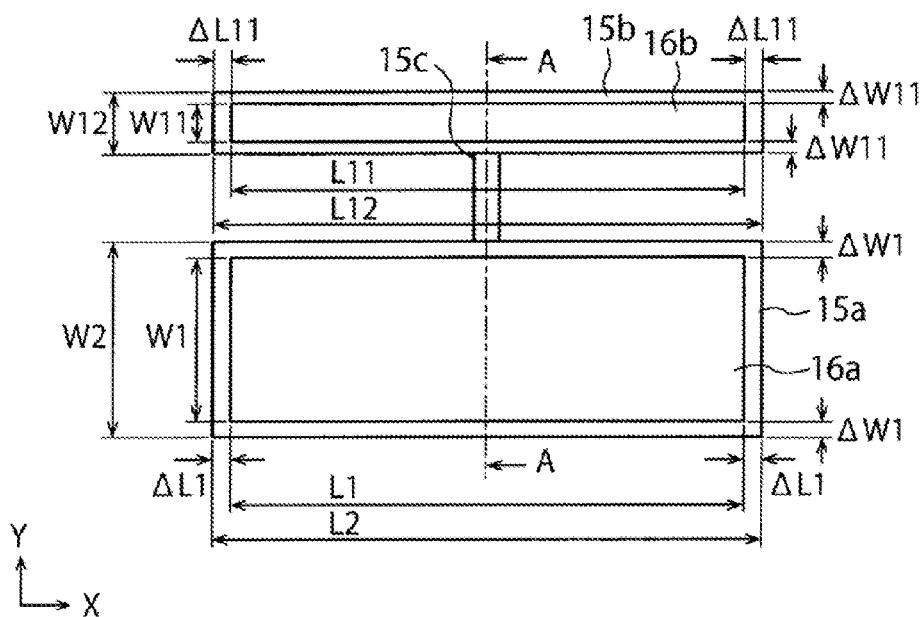
FIG. 7A is a plan view of an enlarged region D depicted in FIG. 4.
Figure 7B:
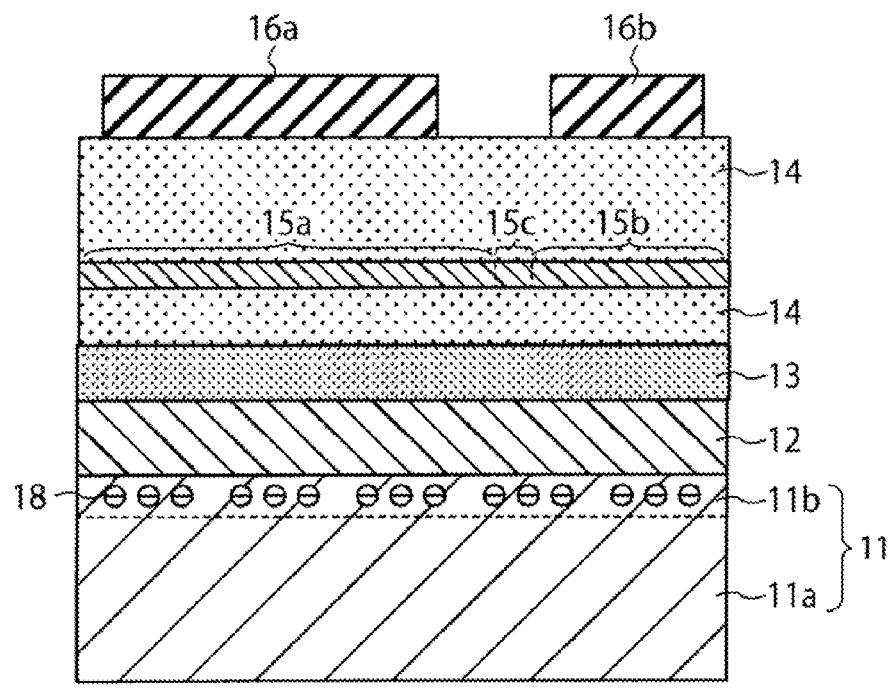
FIG. 7B is a cross-sectional view taken at line A-A in FIG. 7A.

FIG. 7A is a plan view of an enlarged region D, the region D depicted in FIG. 4, and FIG. 7B is a cross-sectional view taken at line A-A in FIG. 7A.

As depicted in FIG. 7A, the outer edge of the first conductive region 15a is located outside the outer edge of the high-frequency wiring 16a in a plan view. That is, the width W2 of the first conductive region 15a is greater than the line width W1 of the high-frequency wiring 16a (W2>W1). Specifically, the outer edge of the first conductive region 15a is located outside the outer edge of the high-frequency wiring 16a by ΔW1=(W2−W1)/2 in a width direction Y. In other words, the outer edge of the first conductive region 15a is located outside the outer edge of the high-frequency wiring 16a in both a +Y direction and a −Y direction.

The width W2 of the first conductive region 15a is greater than the line width W1 of the high-frequency wiring 16a to allow the first conductive region 15a to block the electric flux lines which emanate from the end of the high-frequency wiring 16a in the width direction Y so as to spread outside when a high-frequency signal passes through the high-frequency wiring 16a.

The line width W1 of the high-frequency wiring 16a is determined with consideration given to, for example, a high-frequency loss, a characteristic impedance, and the like. When the high-frequency power is about 20 dBm, for example, the line width W1 of the high-frequency wiring 16a is about 50 μm, for example. On the other hand, the width W2 of the first conductive region 15a is determined in accordance with the degree of spread of the electric flux lines, specifically, the distance between the first conductive region 15a and the high-frequency wiring 16a (in other words, the thickness of the interlayer dielectric 14) and the like. The width W2 of the first conductive region 15a is, for example, about 1.5 times the line width W1 of the high-frequency wiring 16a, specifically, about 70 μm when W1 is about 50 μm.

Likewise, the length L2 of the first conductive region 15a is also longer than the length L1 of the high-frequency wiring 16a (L2>L1). Specifically, the outer edge of the first conductive region 15a is located outside the outer edge of the high-frequency wiring 16a by ΔL1=(L2−L1)/2 in a length direction X. In other words, the outer edge of the first conductive region 15a is located outside the outer edge of the high-frequency wiring 16a in both a +X direction and a −X direction.

Moreover, the outer edge of the second conductive region 15b of the conductive layer 15 is located outside the outer edge of the grounding wiring 16b in a plan view. That is, the width W12 of the second conductive region 15b is greater than the line width W12 of the grounding wiring 16b (W12>W11). Specifically, the outer edge of the second conductive region 15b is located outside the outer edge of the grounding wiring 16b by ΔW11=(W12−W11)/2 in a width direction Y. In other words, the outer edge of the second conductive region 15b is located outside the outer edge of the grounding wiring 16b in both a +Y direction and a −Y direction.

Likewise, the length L12 of the second conductive region 15b is also longer than the length L11 of the grounding wiring 16b (L12>L11). Specifically, the outer edge of the second conductive region 15b is located outside the outer edge of the grounding wiring 16b by ΔL11=(L12−L11)/2 in the length direction X. In other words, the outer edge of the second conductive region 15b is located outside the outer edge of the grounding wiring 16b in both the +X direction and the −X direction.

Figure 8:
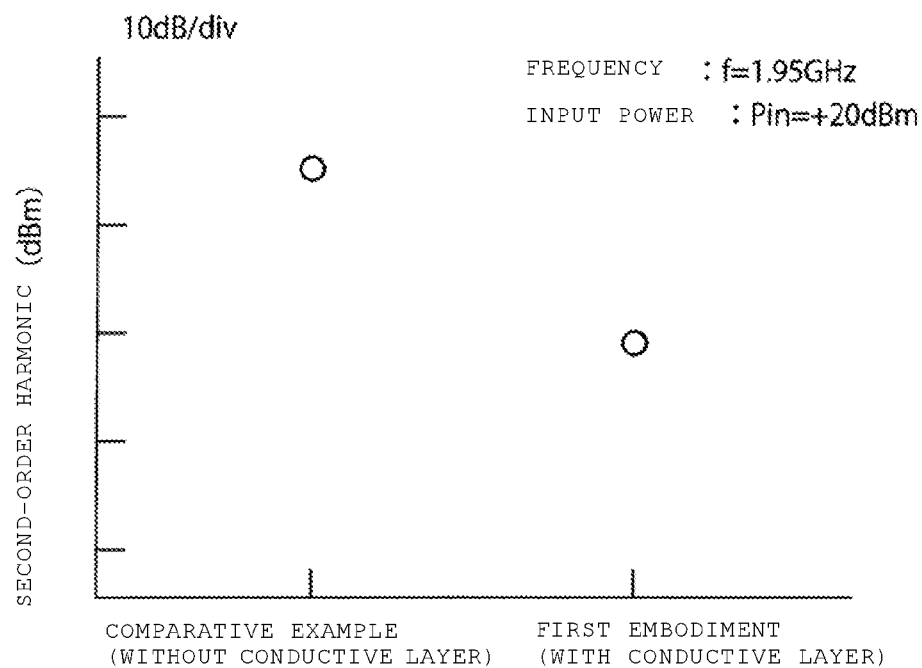
FIG. 8 is a diagram depicting a comparison of harmonic distortion of the semiconductor switch according to the first embodiment and a semiconductor switch according to a comparative example.

FIG. 8 is a diagram depicting a comparison of harmonic distortion between the semiconductor switch according to the first embodiment and a semiconductor switch according to a comparative example. The semiconductor switch according to the comparative example is a semiconductor switch having no conductive layer 15. In FIG. 8, the vertical axis represents the second-order harmonic power (dBm) in the high-frequency signal. The frequency of the high-frequency signal is 1.95 GHz and the input power is 20 dBm.

As depicted in FIG. 8, the second-order harmonic power of the semiconductor switch 10 according to this first embodiment is reduced by about 16 dB as compared to the semiconductor switch according to the comparative example.

With the above-described semiconductor switch 10, the conductive layer 15 in which the mobility of carriers is high is formed between the wiring layer 16 and the insulating film 12. Therefore, even when the electric flux lines are generated as a result of the high-frequency signal passing through the high-frequency wiring 16a, the electric flux lines are blocked by the conductive layer 15. As a result, because the charges 18 accumulated at the interface between the semiconductor substrate 11 and the insulating film 12 are better shielded from electric flux effects, the charges 18 are less influenced by high-frequency signals passing through the high-frequency wiring 16a. Thus, harmonic distortion of the high-frequency signal and a high-frequency loss of the high-frequency wiring 16a may be reduced.

Figure 9A:
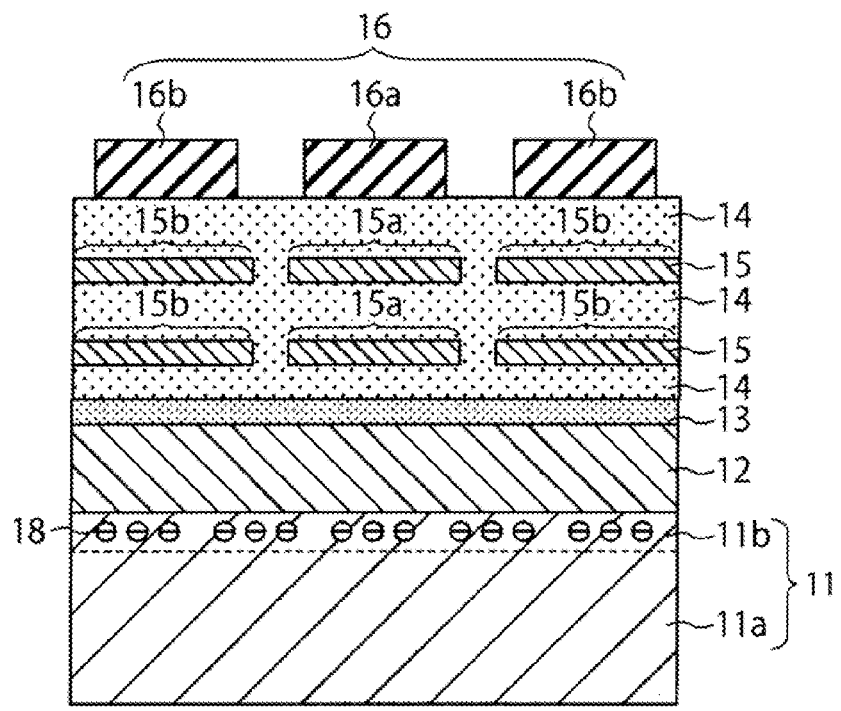
FIGS. 9A and 9B are cross-sectional views depicting a portion of a semiconductor switch according to a modified example of the first embodiment.
Figure 9B:
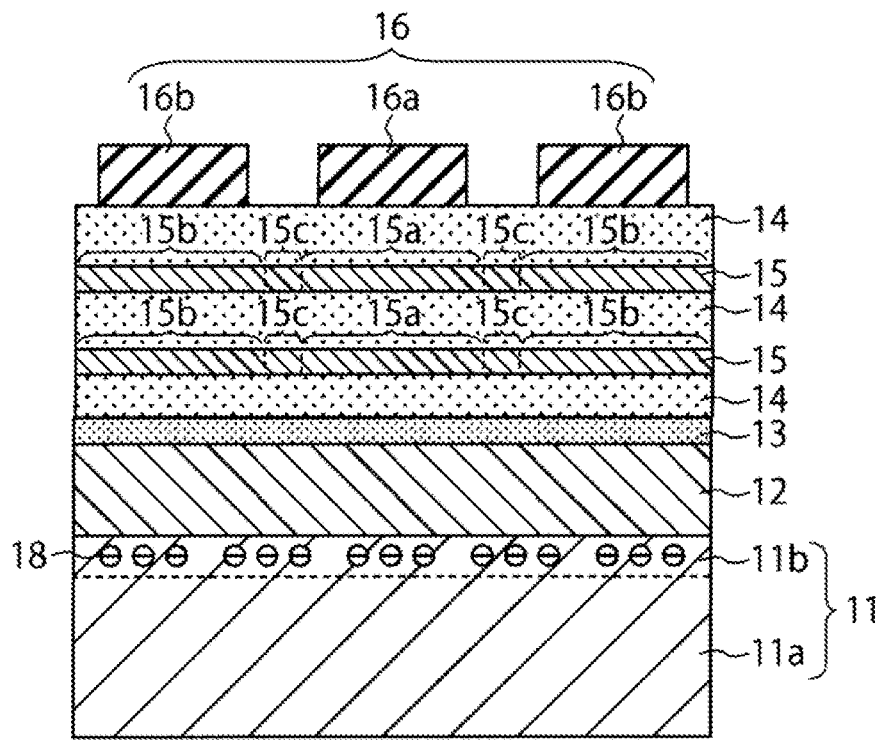

Hereinafter, modified examples of this first embodiment are described. FIGS. 9A and 9B are cross-sectional views depicting the configuration of a portion of a semiconductor switch according to a modified example of the first embodiment. FIG. 9A corresponds to the cross-sectional view taken at line A-A depicted in FIG. 1 and FIG. 9B corresponds to the cross-sectional view taken at line B-B depicted in FIG. 1.

As depicted in FIGS. 9A and 9B, the semiconductor switch according to this modified example includes a plurality of conductive layers 15 layered one above the other. As a result, the effect of blocking the electric flux lines heading for the interface between the semiconductor substrate 11 and the insulating film 12 from the high-frequency wiring 16a may be further enhanced. Thus, harmonic distortion of the high-frequency signal and a high-frequency loss of the high-frequency wiring 16a may be further reduced.

Figure 10:
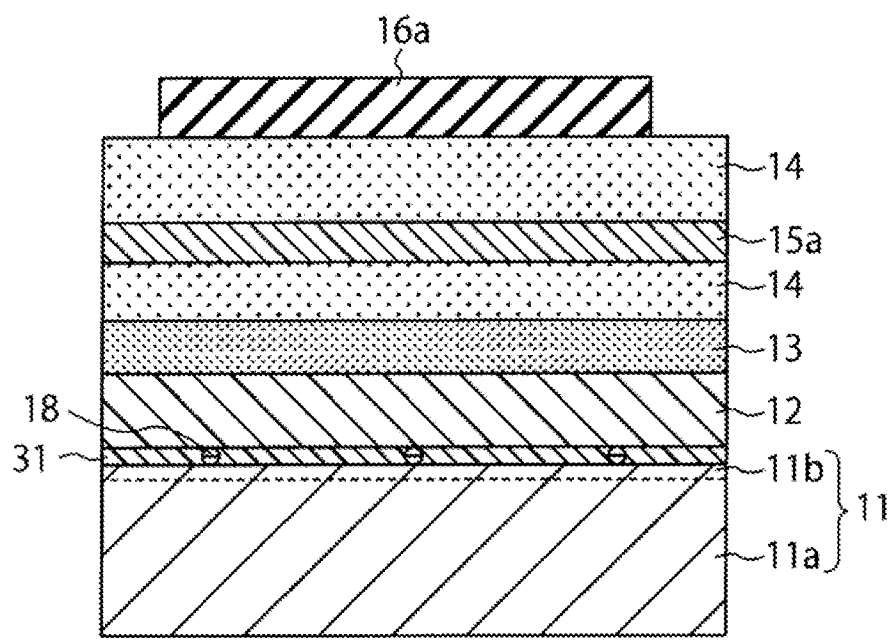
FIG. 10 is a cross-sectional view depicting a portion of a semiconductor switch according to another modified example of the first embodiment.

Hereinafter, another modified example is described. FIG. 10 is a cross-sectional view depicting the configuration of a portion of a semiconductor switch according to another modified example of the first embodiment. In the first embodiment, the second layer 11b of the semiconductor substrate 11 and the insulating film 12 are in direct contact with each other. In this modified example, another layer, for example, a modified layer 31 is formed between the second layer 11b and the insulating film 12.

The modified layer 31 is formed of, for example, silicon containing a crystal defect. Since the presence of the crystal defect of the modified layer 31 increases the probability of the charges 18 accumulated at the interface between the semiconductor substrate 11 and the insulating film 12 being trapped, the potential movement of the charges 18 near the interface is further reduced.

The modified layer 31 may be formed in the following manner, for example. A pulse laser beam of a wavelength passing through a silicon dioxide film is emitted toward an area near the interface between the second layer 11b and the insulating film 12 from the side where the insulating film 12 is located.

Since the second layer 11b (or a portion thereof) melts by absorbing the laser light, a portion of the second layer 11b becomes the modified layer 31 when re-solidified. Incidentally, since the semiconductor layer 19 is thin, the effect of the absorption of the laser light on the semiconductor layer 19 may be ignored.

Alternatively, light is focused near the interface between the semiconductor substrate 11 and the insulating film 12 to a diffraction limit level by emitting a highly-repetitive short pulse laser beam having a wavelength passing through the silicon dioxide film and silicon. The laser beam is temporally and spatially compressed in an extremely local region near the light focus point and therefore has a very high peak power density.

When the peak power density of the laser beam which may pass through silicon exceeds a given threshold value during the course of the process of laser beam focusing, the laser beam locally exhibits very high absorption characteristics. As a result of control being performed such that the peak power density of the laser beam exceeds this threshold value near the focal point near the interface between the semiconductor substrate 11 and the insulating film 12, a portion of the second layer 11b becomes the modified layer 31 without damage to the semiconductor layer 19.

The modified layer 31 may be formed all over the SOI substrate 30 or may be formed only in a region below the high-frequency wiring 16a. The modified layer 31 may be a different silicon layer such as a layer with a different impurity concentration or a layer with a different conductivity type. Additionally, the switch circuits SW1 to SW8 may be formed of a junction field-effect transistor or the like.

Figure 11A:
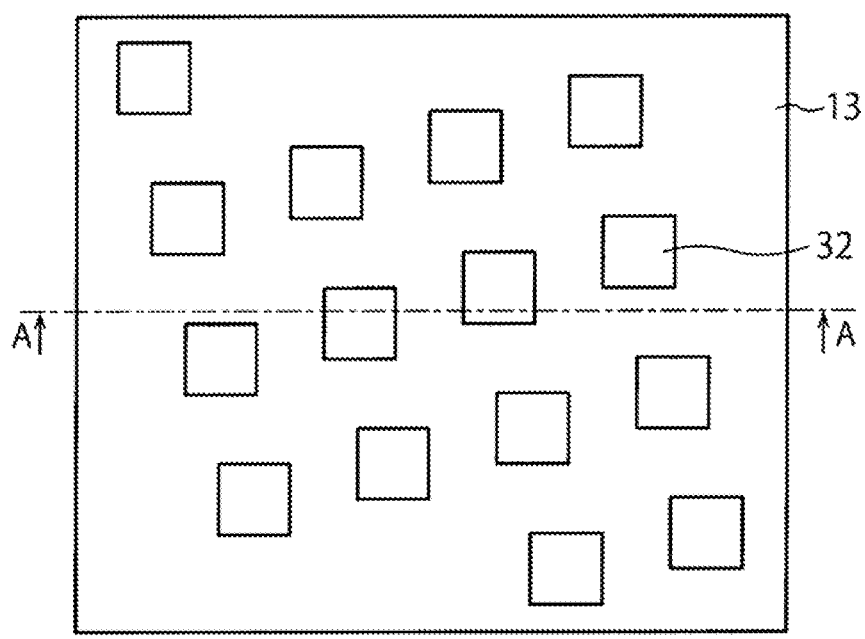
FIG. 11A is a plan view depicting a portion of a semiconductor switch according to still another modified example of the first embodiment.

Hereinafter, still another modified example is described. FIG. 11A is a plan view depicting the configuration of a portion of a semiconductor switch according to still another modified example of the first embodiment, and FIG. 11B is a cross-sectional view taken at line A-A in FIG. 11A.

Figure 11B:
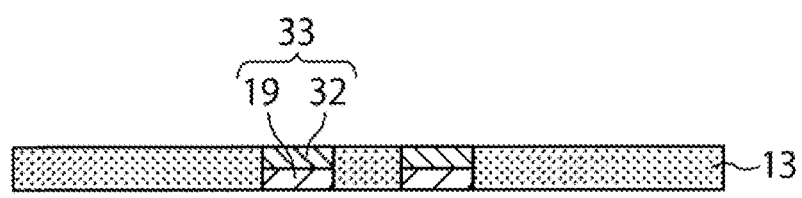
FIG. 11B is a cross-sectional view taken at line A-A in FIG. 11A.

In this modified example, as depicted in FIG. 11B, a plurality of dummy SOI layers 33 is arranged in the STI layer 13. Additionally, though not specifically depicted in FIGS. 11A and 11B, these dummy SOI layers 33 are formed on the insulating film 12 and below the high-frequency wiring 16a. As depicted in FIG. 11B, each dummy SOI layer 33 is formed of the semiconductor layer (the SOI layer) 19 and a silicide layer 32 formed on the semiconductor layer (the SOI layer) 19. Specifically, each semiconductor layer 19 originally has the same thickness as the STI layer 13, and a silicide layer 32 is formed from an upper portion of the initial semiconductor layer 19 and a metal placed on semiconductor layer 19 by heat treatment. This metal is subsequently removed later.

According to this modified example, since each dummy SOI layer 33 functions as a floating conductive layer 15, the effect of blocking the electric flux lines may be further enhanced.

Second Embodiment

Figure 12A:
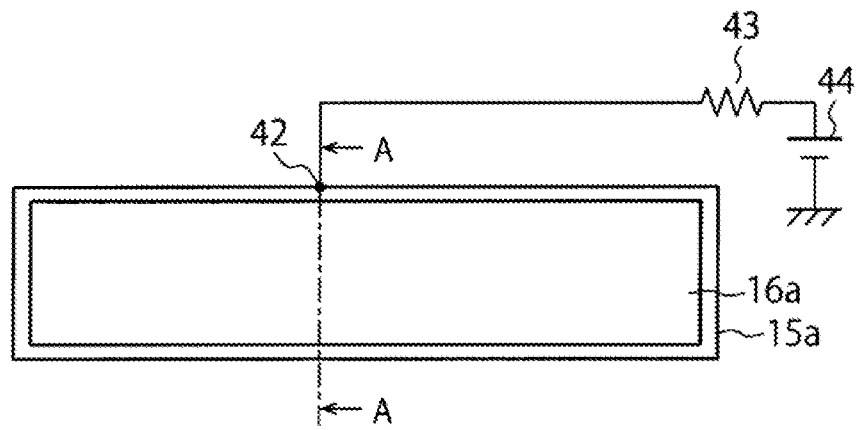
FIG. 12A is a plan view depicting a portion of a semiconductor switch according to a second embodiment.
Figure 12B:
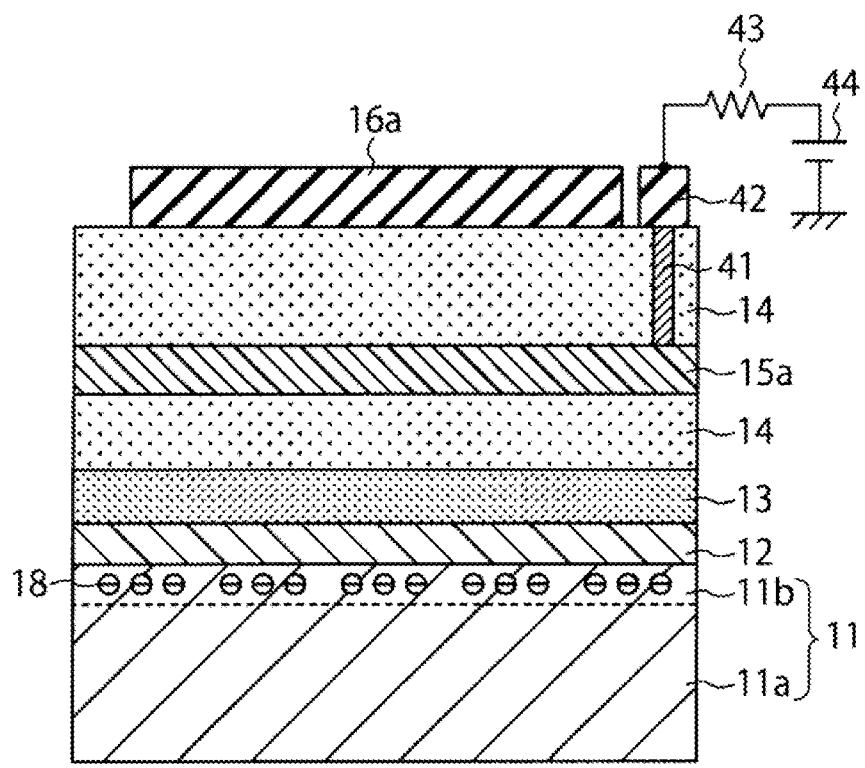
FIG. 12B is a cross-sectional view taken at line A-A in FIG. 12A.

A semiconductor switch according to a second embodiment is described by using FIGS. 12A and 12B. FIG. 12A is a plan view depicting the configuration of a portion of the semiconductor switch according to the second embodiment, and FIG. 12B is a cross-sectional view taken at line A-A in FIG. 12A. Hereinafter, such component elements as are found also in the first embodiment described above are identified with the same characters, and the explanations thereof are omitted. In the following description, differences from the first embodiment are explained.

The semiconductor switch according to this second embodiment differs from the semiconductor switch 10 according to the first embodiment in that the conductive layer 15 is positively biased with respect to the semiconductor substrate 11. Specifically, as depicted in FIGS. 12A and 12B, in the semiconductor switch according to this second embodiment, a first via 41 is formed near the high-frequency wiring 16a. The first via 41 pierces through the interlayer dielectric 14 and reaches the first conductive region 15a of the conductive layer 15.

Furthermore, on the interlayer dielectric 14, a pad 42 electrically connected to the first via 41 is provided. The pad 42 is connected to a power supply 44 via a resistor 43. The resistor 43 has a sufficiently high resistance value such that the conductive layer 15 effectively becomes floating in terms of a high frequency. As the resistance value, 200 kΩ or more, for example, is suitable.

In the semiconductor switch according to this second embodiment, since a positive voltage is applied to the conductive layer 15, the conductive layer 15 is positively biased with respect to the semiconductor substrate 11. Therefore, the charges 18 accumulated at the interface between the semiconductor substrate 11 and the insulating film 12 are attracted by Coulomb force toward the side where the conductive layer 15 is located. As a result, since a free movement of the charges 18 is reduced, the occurrence of harmonic distortion may be reduced more reliably. Furthermore, a power loss of the high-frequency wiring 16a may be further reduced.

With the above-described semiconductor switch according to this second embodiment, as in the first embodiment, the conductive layer 15 is formed between the wiring layer 16 and the insulating film 12. Therefore, even when the electric flux lines are generated as a result of the high-frequency signal passing through the high-frequency wiring 16*a*, the electric flux lines are blocked by the conductive layer 15. As a result, since (in effect) the number of electric flux lines that act on the charges 18 accumulated at the interface between the semiconductor substrate 11 and the insulating film 12 is reduced, the effect of reducing the movement of the charges 18 is enhanced. Thus, harmonic distortion of the high-frequency signal and a high-frequency loss of the high-frequency wiring 16*a* may be reduced.

In particular, in this second embodiment, as a result of the conductive layer 15 being connected to the power supply 44 via the first via 41, the potential of the conductive layer 15 becomes higher than the potential of the semiconductor substrate 11. Therefore, since the charges 18 accumulated at the interface between the semiconductor substrate 11 and the insulating film 12 are attracted by Coulomb force toward the side where the conductive layer 15 is located, the charges 18 unlikely to move. Thus, harmonic distortion may be further reduced.

Third Embodiment

Figure 13A:
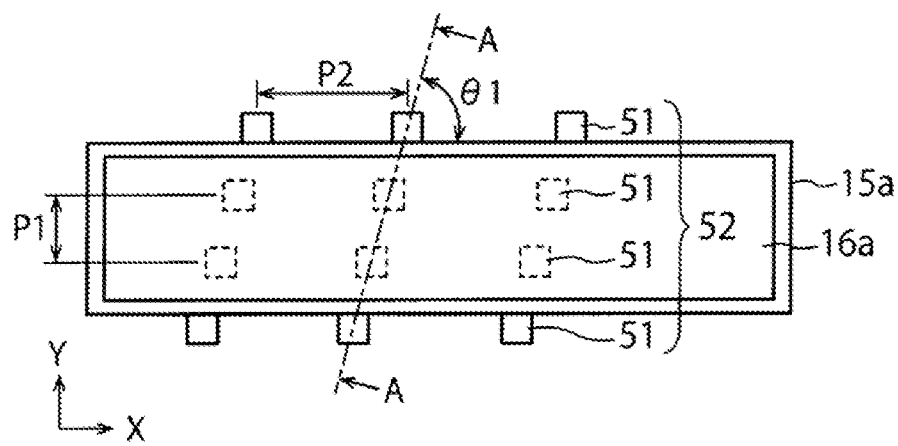
FIG. 13A is a plan view depicting a portion of a semiconductor switch according to a third embodiment.
Figure 13B:
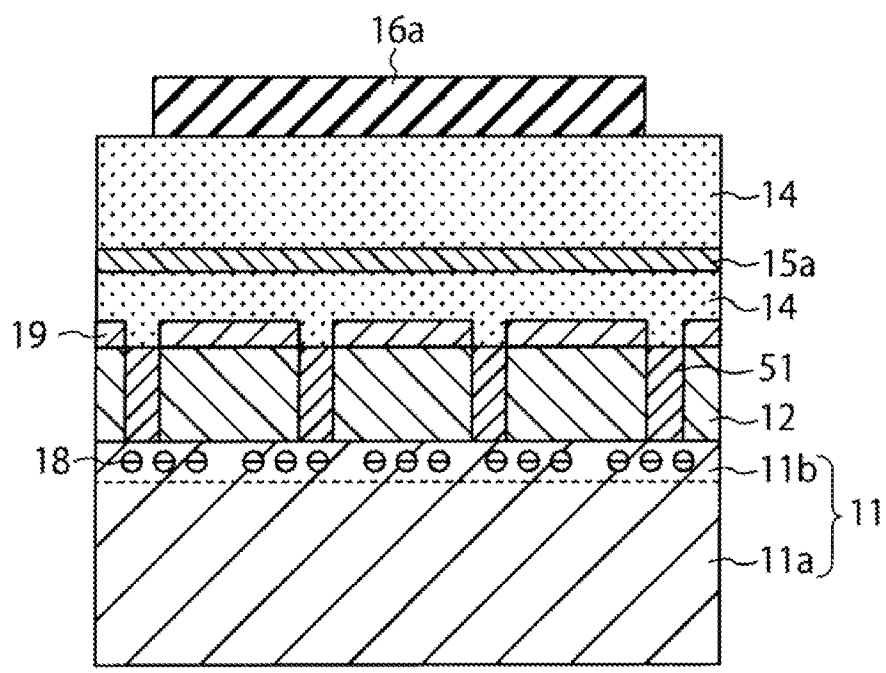
FIG. 13B is a cross-sectional view taken at line A-A in FIG. 13A.

A semiconductor switch according to a third embodiment is described with reference to FIGS. 13A and 13B. FIG. 13A is a plan view depicting the configuration of a portion of the semiconductor switch according to the third embodiment, and FIG. 13B is a cross-sectional view taken at line A-A in FIG. 13A. Hereinafter, such component elements as are found also in the first embodiment described above are identified with the same characters, and the explanations thereof are omitted. In the following description, differences from the first embodiment are explained.

The semiconductor switch according to this third embodiment differs from the semiconductor switch 10 according to the first embodiment in that the semiconductor switch according to this third embodiment includes a plurality of second vias 51. The second vias 51 are a plurality of columnar bodies passing through the insulating film 12. Specifically, as depicted in FIGS. 13A and 13B, in the semiconductor switch according to this third embodiment, the plurality of second vias 51 which pass through the insulating film 12 and reach the semiconductor substrate 11 are formed. Each second via 51 has a third specific resistance ρ3 which is higher than the first specific resistance ρ1 of the semiconductor substrate 11. The third specific resistance ρ3 is about $1 \times 10^6$ to $1 \times 10^9$ Ω·cm, for example.

Each second via 51 is formed of a polysilicon film to which both a large quantity of donor impurities and a large quantity of acceptor impurities are added. By making the donor impurity concentration and the acceptor impurity concentration nearly equal to each other, the donors and the acceptors compensate for each other, whereby polysilicon having the high third specific resistance ρ3 is obtained.

The plurality of second vias 51 form via lines 52 in which second vias 51 are diagonally arranged at a predetermined angle θ1 with respect to the length direction X of the high-frequency wiring 16*a*. In each via line 52, the second vias 51 are arranged at predetermined intervals P1 in the width direction Y of the high-frequency wiring 16*a*. Moreover, the second vias 51 located at the ends of each via line 52 are arranged outside the ends of the high-frequency wiring 16*a*. Furthermore, the via lines 52 are arranged at predetermined intervals P2 in the X direction. That is, spacing between second vias 51 in adjacent via lines 52 along the X direction is at the predetermined interval P2. Furthermore, in the depicted example, second vias 51 in adjacent via lines 52 are aligned with each other along the X direction.

In the semiconductor switch according to this third embodiment, since the second vias 51 are in contact with the semiconductor substrate 11, there is no insulating film 12 under the second via 51. Therefore, since there is no interface between the insulating film 12 and the semiconductor substrate 11, the charges 18 which might otherwise accumulate near such an interface also do not exist. As a result, the overall amount of charges 18 which accumulate near the interface between insulating film 12 and semiconductor substrate 11 may be reduced.

Furthermore, when the second vias 51 are polysilicon, the charges 18 passing under the second vias 51 are more likely to be trapped by crystal defects since polysilicon contains a lot of crystal defects. Thus, the overall amount of charges 18 which accumulate near the interface may be further reduced. As a result, the occurrence of harmonic distortion may be reduced more reliably and a power loss of the high-frequency wiring 16*a* may be further reduced.

With the above-described semiconductor switch according to this third embodiment, as in the first embodiment, the conductive layer 15 is formed between the wiring layer 16 and the insulating film 12. Therefore, even when the electric flux lines are generated as a result of the high-frequency signal passing through the high-frequency wiring 16*a*, the electric flux lines are blocked by the conductive layer 15. As a result, since the number (in effect) of electric flux lines that act on the charges 18 accumulated at the interface between the semiconductor substrate 11 and the insulating film 12 is reduced, the effect of reducing the movement of the charges 18 is enhanced. Thus, harmonic distortion of the high-frequency signal and a high-frequency loss of the high-frequency wiring 16*a* may be reduced.

In particular, in this third embodiment, the amount of charges 18 which are accumulated at the interface between the semiconductor substrate 11 and the insulating film 12 is reduced by the presence of second vias 51. As a result, harmonic distortion of the high-frequency signal may be further reduced.

Furthermore, in this third embodiment, the plurality of second vias 51 is two-dimensionally arranged within the insulating film 12. When the distance between the second vias 51 is short, the insulating film 12 may be damaged during formation of the second vias 51. However, in this third embodiment, the plurality of second vias 51 is two-dimensionally arranged in the length direction X (a first direction) and a diagonal direction (a second direction) with respect to the length direction X. As a result, as compared to a case in which the plurality of second vias 51 are arranged in the length direction X and the width direction Y orthogonal to the length direction X, the distance between the second vias 51 becomes longer. Thus, with the semiconductor switch according to this third embodiment, the insulating film 12 is less likely to be damaged.

Additionally, in this third embodiment, the second vias 51 may be positively biased with respect to the semiconductor substrate 11. In this case, the second vias 51 attract the charges 18 by Coulomb force and limit a free movement of the charges 18. As a result, harmonic distortion may be further reduced.

Fourth Embodiment

A semiconductor switch according to a fourth embodiment is described with reference to FIGS. 14A and 14B.

Figure 14A:
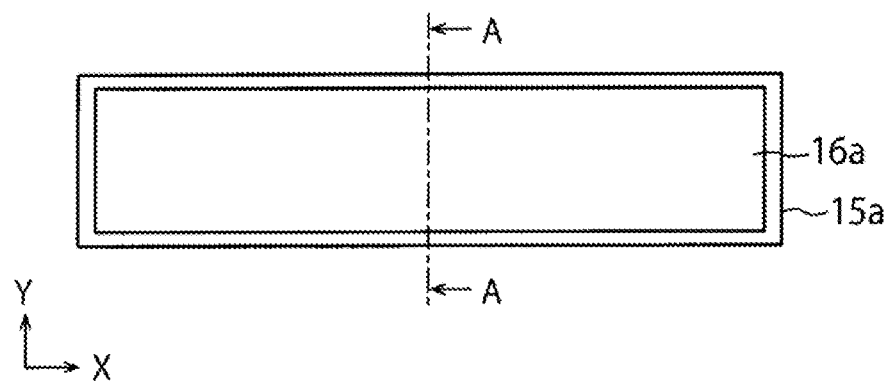
FIG. 14A is a plan view depicting a portion of a semiconductor switch according to a fourth embodiment.
Figure 14B:
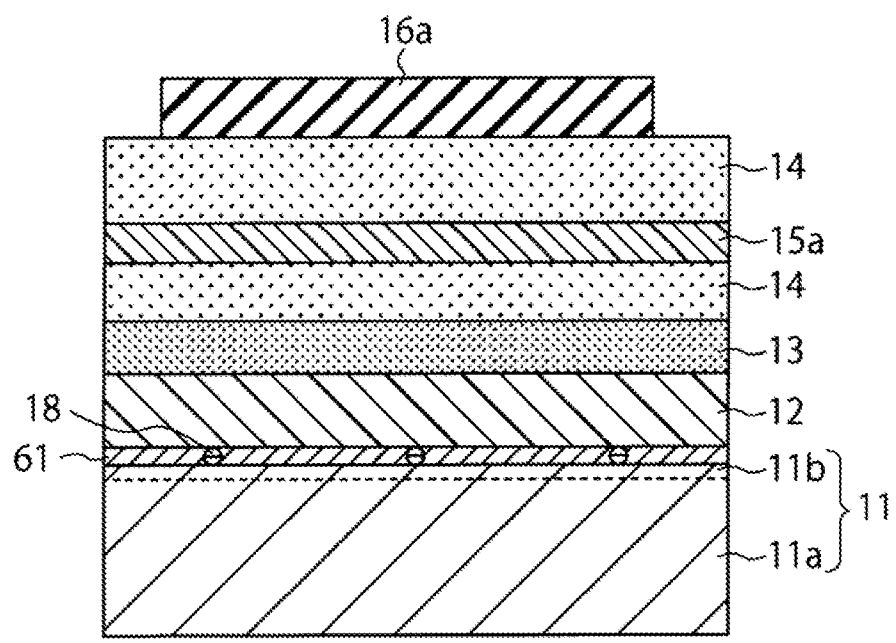
FIG. 14B is a cross-sectional view taken at line A-A in FIG. 14A.

FIG. 14A is a plan view depicting the configuration of a portion of the semiconductor switch according to this embodiment, and FIG. 14B is a cross-sectional view taken at line A-A in FIG. 14A. Hereinafter, such component elements as are found also in the first embodiment described above are identified with the same characters, and the explanations thereof are omitted. In the following description, differences from the first embodiment are explained.

The semiconductor switch according to this fourth embodiment differs from the semiconductor switch 10 according to the first embodiment in that the semiconductor switch according to this fourth embodiment includes a charge trapping layer 61 between the semiconductor substrate 11 and the insulating film 12.

The charge trapping layer 61 is formed of a silicon layer having a high concentration of charge carrier traps. In the silicon layer, the concentration of charge carrier traps can be changed by changing amounts of impurities and/or irregularities in structure (defect level) of the silicon layer. As a method for measuring the electrically active defect levels (charge carrier traps) in semiconductor materials, there is deep level transient spectroscopy (DLTS), for example. DLTS is a method by which a change in the charged state of the defect level associated with the trapping of a carrier in the defect level or the release of a carrier from the defect level is detected as a change in capacitance between terminals of a capacitance element (a MIS capacitance element) formed as a stacked body of a Schottky junction diode, metal, an insulating film, and a semiconductor.

The charge trapping layer 61 may be obtained by setting the conditions such as growth temperature and concentration of process gases (e.g., oxygen) during epitaxial growth such that a charge carrier trap concentration becomes higher. With an epitaxial growth method, the charge trapping layer 61 may be formed all over the semiconductor substrate 11. The concentration electrically active defects (charge carrier traps) is about 1E16 to 1E18 $cm^{-3}$, for example.

In the semiconductor switch according to this fourth embodiment, since the charges 18 (or some portion thereof) which would otherwise be accumulated at the interface between the semiconductor substrate 11 and the insulating film 12 are trapped by the charge trapping layer 61, the amount of charges 18 is reduced. Furthermore, as a result of the charges 18 being compensated for by a high concentration of acceptors of the second layer 11b, the amount of charge 18 is further reduced. As a result, the occurrence of harmonic distortion may be reduced more reliably and a power loss of the high-frequency wiring 16a may be further reduced.

As described above, with the semiconductor switch according to this fourth embodiment, as in the first embodiment, the conductive layer 15 is formed between the wiring layer 16 and the insulating film 12. Therefore, even when the electric flux lines are generated as a result of the high-frequency signal passing through the high-frequency wiring 16a, the electric flux lines are blocked by the conductive layer 15. As a result, since the number (in effect) of electric flux lines that act on the charges 18 accumulated at the interface between the semiconductor substrate 11 and the insulating film 12 is reduced, the effect of reducing the movement of the charges 18 is enhanced. Thus, harmonic distortion of the high-frequency signal and a high-frequency loss of the high-frequency wiring 16a may be reduced.

In particular, in this fourth embodiment, the charge trapping layer 61 is formed between the semiconductor substrate 11 and the insulating film 12. As a result of this charge trapping layer 61 trapping the some portion of charges 18 which otherwise would be accumulated at the interface between the semiconductor substrate 11 and the insulating film 12, the amount of charges 18 is reduced. Thus, harmonic distortion of the high-frequency signal may be further reduced.

Figure 15A:
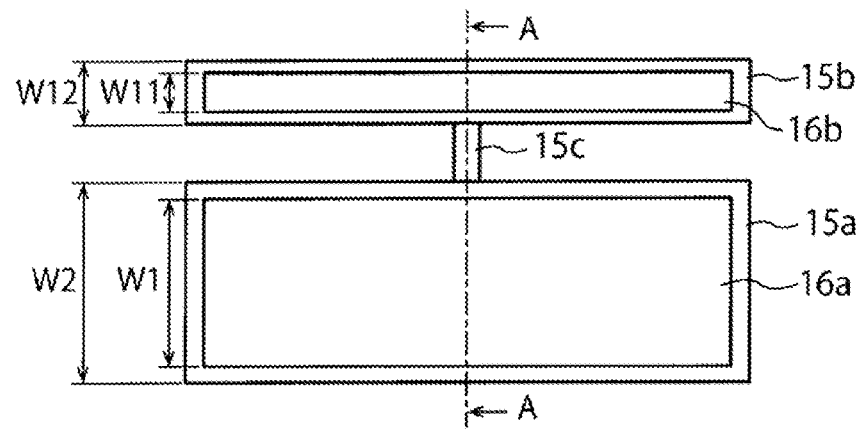
FIG. 15A is a plan view depicting the configuration of another portion of the semiconductor switch according to the fourth embodiment.
Figure 15B:
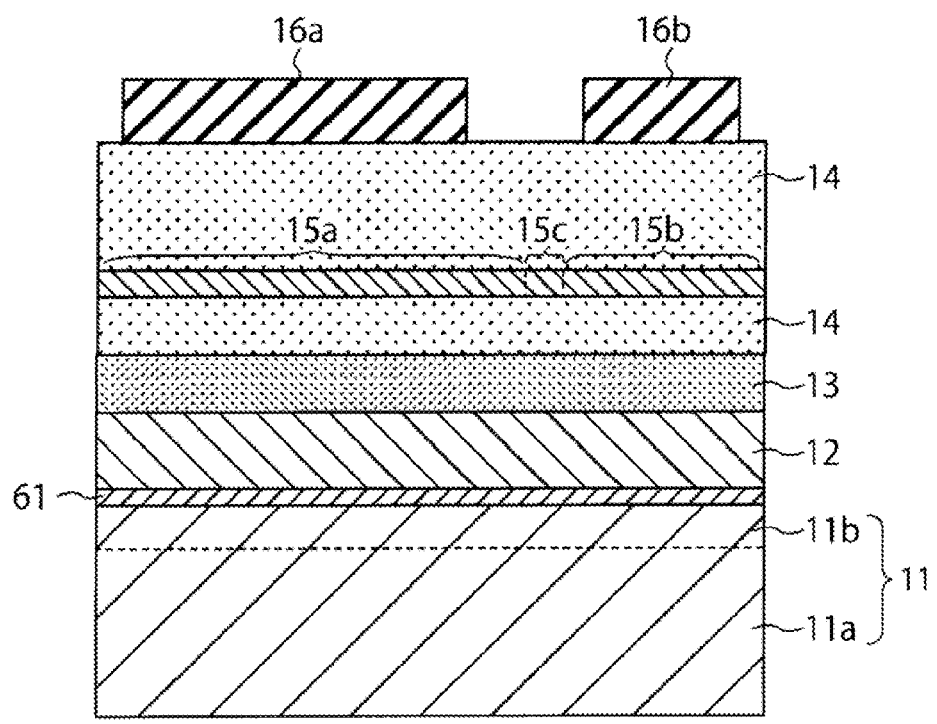
FIG. 15B is a cross-sectional view taken at line A-A in FIG. 15A.

Additionally, as depicted in FIGS. 15A and 15B, the charge trapping layer 61 may be formed not only below the high-frequency wiring 16a but also below the grounding wiring (ground line) 16b. In this case, since the charge trapping layer 61 may trap the charges 18 located below the grounding wiring 16b, the amount of charges 18 may be further reduced.

Figure 16A:
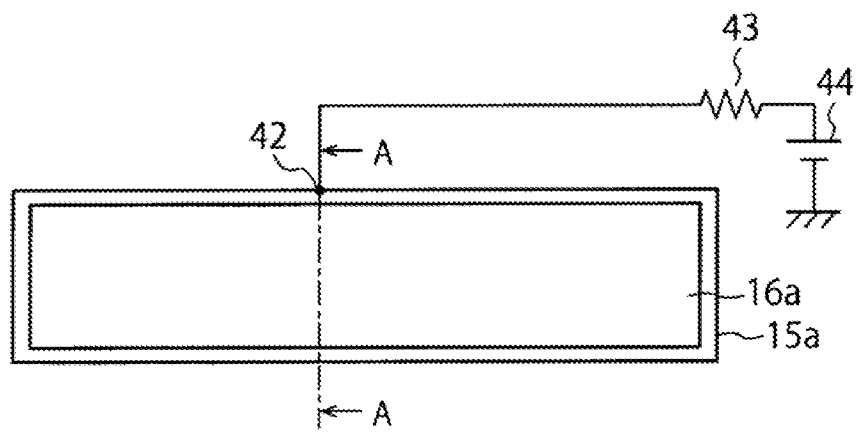
FIG. 16A is a plan view depicting a portion of a semiconductor switch according to a modified example of the fourth embodiment.

Hereinafter, modified examples of this fourth embodiment are described. FIG. 16A is a plan view depicting the configuration of a portion of a semiconductor switch according to a modified example of the fourth embodiment, and FIG. 16B is a cross-sectional view taken at line A-A in FIG. 16A.

Figure 16B:
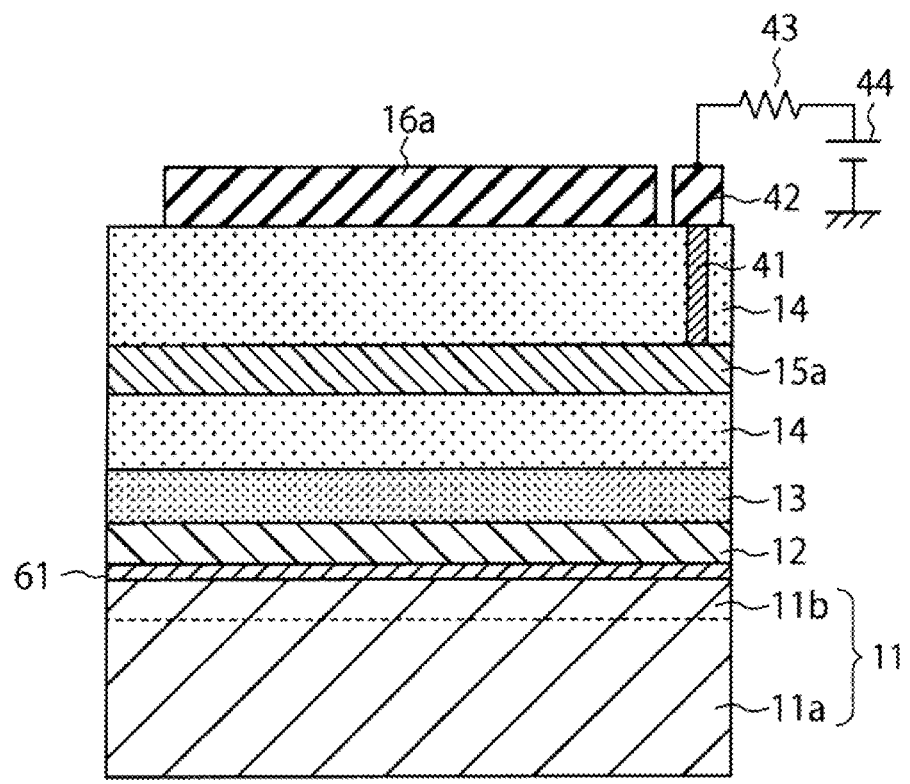
FIG. 16B is a cross-sectional view taken at line A-A in FIG. 16A.

In FIGS. 16A and 16B, a semiconductor switch obtained by adding the charge trapping layer 61 to the second embodiment (depicted in FIGS. 12A and 12B) is depicted. According to this modified example, while the movement of the charges 18 accumulated at the interface between the semiconductor substrate 11 and the insulating film 12 is limited by the conductive layer 15 kept at a positive potential, the amount of charges 18 at the interface is reduced by the charge trapping layer 61. As a result, harmonic distortion may be further reduced.

Figure 17A:
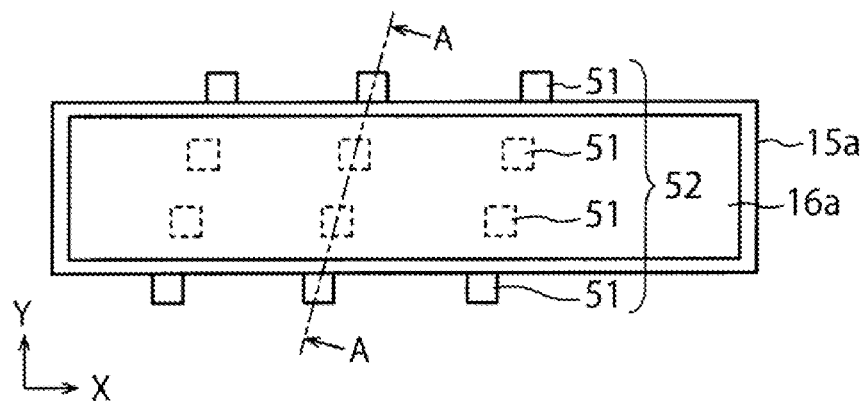
FIG. 17A is a plan view depicting a portion of a semiconductor switch according to another modified example of the fourth embodiment.
Figure 17B:
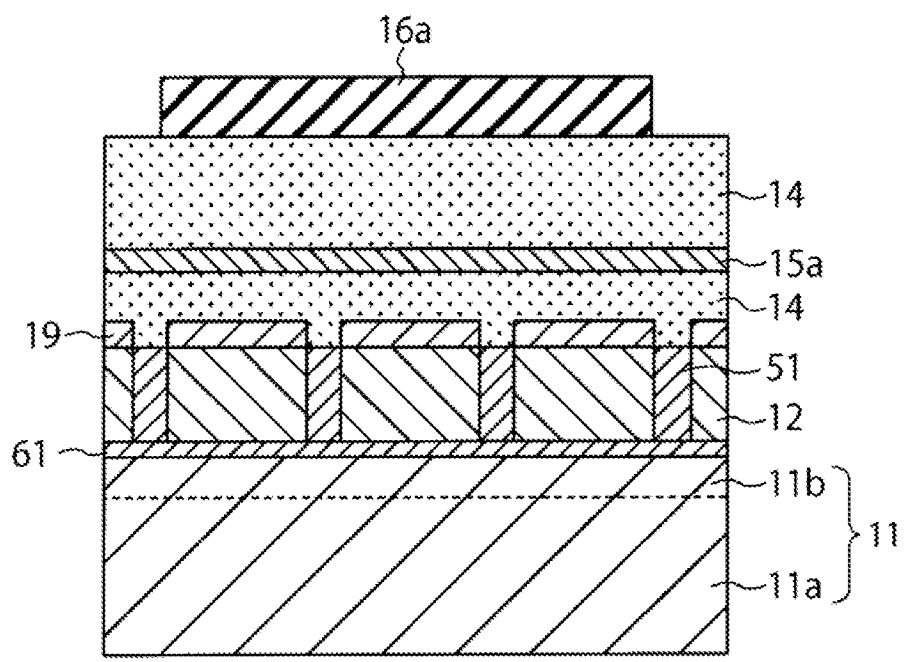
FIG. 17B is a cross-sectional view taken at line A-A in FIG. 17A.

FIG. 17A is a plan view depicting the configuration of a portion of a semiconductor switch according to another modified example of the fourth embodiment, and FIG. 17B is a cross-sectional view taken at line A-A in FIG. 17A.

In FIGS. 17A and 17B, a semiconductor switch obtained by adding charge trapping layer 61 to the semiconductor switch according to the third embodiment (depicted in FIGS. 13A and 13B) is depicted. According to this modified example, the second vias 51 piercing through the insulating film 12 and the charge trapping layer 61 may further reduce the amount of charges 18 which are accumulated between the semiconductor substrate 11 and the insulating film 12. As a result, harmonic distortion may be further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch, comprising:
   a semiconductor substrate;
   an insulating film on the semiconductor substrate;
   a conductive layer on the insulating film;
   a wiring layer comprising a first wire and a second wire above the conductive layer, the first wire carrying a high-frequency signal and the second wire connected to ground; and
   a switching circuit on a first portion of the insulating film, the switching circuit configured to switch a path of the high-frequency signal, wherein
   a width of a first conductive region of the conductive layer is greater than a width of the first wire, the first conductive region being between a second portion of the insulating layer and the first wire, the second portion being adjacent to the first portion in a first direction; and
a width of a second conductive region of the conductive layer is greater than a width of the second wire, the second conductive region being between the second portion of the insulating layer and the second wire.

2. The semiconductor switch according to claim 1, wherein the insulating film comprises a buried oxide layer, a shallow trench isolation layer, and an interlayer dielectric layer.

3. The semiconductor switch according to claim 2, wherein the first portion of the insulating film includes only the buried oxide layer.

4. The semiconductor switch according to claim 1, wherein the conductive layer is connectable to a power supply potential such that an electrical potential of the conductive layer is higher than an electrical potential of the semiconductor substrate.

5. The semiconductor switch according to claim 2, wherein
the interlayer dielectric layer covers the conductive layer, and
a first via in the interlayer dielectric layer contacts the conductive layer such that the conductive layer is connectable to a power supply potential through the first via.

6. The semiconductor switch according to claim 1, further comprising:
a second via in a second portion of the insulating film adjacent to the first portion in the first direction, the second via contacting the semiconductor substrate,
wherein a specific resistance of the second via is higher than a specific resistance of the semiconductor substrate.

7. The semiconductor switch according to claim 6, wherein a plurality of second vias are regularly arranged in the second portion of the insulating film along a first direction and along a second direction diagonal with respect to the first direction.

8. The semiconductor switch according to claim 1, further comprising:
a charge trapping layer between the semiconductor substrate and the insulating film.

9. The semiconductor switch according to claim 1, wherein the conductive layer is a metal layer or a metal silicide layer.

10. The semiconductor switch according to claim 1, wherein the conductive layer includes a first conductive layer and a second conductive layer between the first conductive layer and the wiring layer, the first and second conductive layers being separated from each other by an insulating material.

11. The semiconductor switch according to claim 1, wherein
a third conductive region of the conductive layer is between the first and second conductive regions in a direction parallel to a surface of the semiconductor substrate.

12. A semiconductor switch, comprising:
a semiconductor substrate having a first region and a second region in a same plane, the first region being adjacent to the second region;
an insulating film formed on the semiconductor substrate in the first and second regions;
a switch circuit formed over the insulating film on the first region;
an interlayer dielectric layer formed over the insulating film on the second region and the switch circuit on the first region; and
a first wiring on the interlayer dielectric layer on the second region, the first wiring including a signal wire and a ground wire;
a first conductive region formed in the interlayer dielectric layer between the signal wire and the insulating film on the second region; and
a second conductive region formed in the interlayer dielectric layer between the ground wire and the insulating film on the second region.

13. The semiconductor switch according to claim 12, wherein
the first conductive region and the second conductive region each include a plurality of conductive layers embedded in the interlayer dielectric layer, and
each conductive layer is in a separate plane within a thickness of the interlayer dielectric.

14. The semiconductor switch according to claim 12, further comprising:
a semiconductor layer between the semiconductor substrate and the insulating film, the semiconductor layer having at least one of a higher crystal defect density than the semiconductor substrate, a different impurity concentration than the semiconductor substrate, and a different conductivity type than the semiconductor substrate.

15. The semiconductor switch according to 14, wherein the semiconductor layer is a charge trapping layer deposited on the semiconductor substrate.

16. The semiconductor switch according to claim 12, further comprising:
a shallow trench isolation layer over the insulating film on the second region, wherein
the shallow trench isolation layer includes a plurality of dummy SOI layers regularly arranged within the shallow trench isolation layer, the dummy SOI layers each including a semiconductor portion contacting the insulating film and a conductive silicide portion between the semiconductor portion and the first wiring.

17. The semiconductor switch according to claim 12, further comprising:
a pad disposed on the interlayer dielectric film over the second region, the pad being adjacent to, but spaced apart from, the first wiring; and
a via extending through the interlayer dielectric film and electrically connecting the pad to first conductive region, wherein the pad is connectable to a power supply potential to permit the first conductive region to be biased at a positive potential with respect to the semiconductor substrate.

18. The semiconductor switch according to claim 12, further comprising:
a plurality of conductive columnar bodies extending through the insulating film and contacting the semiconductor substrate.

19. An RF switching circuit, comprising:
a switch between first RF terminal and a high-frequency signal line that is connected to an antenna terminal, the switch element disposed on a first region of a substrate, the high-frequency signal line disposed on a second region of the substrate adjacent to the first region, the switch including a first transistor connected between the first RF terminal and the high-frequency signal line and a second transistor connected between the RF terminal and a ground line disposed on a third region of the substrate connected to second region, wherein the substrate comprises a semiconductor portion and an insulating portion on the semiconductor portion, in the first region, a semiconductor layer is disposed on an upper surface of the insulating portion, and portions of the first and second transistors are formed in the semiconductor layer, in the second and third regions, a first insulating layer is disposed on the upper surface of the insulating portion, and a second insulating layer is disposed on the first insulating layer, in the second region, the second insulating layer is between the high-frequency signal line and the first insulating layer, a first conductive region is between the high-frequency signal line and the upper surface of the insulating portion, and at least a first portion of the second insulating layer is between the first conductive region and the high-frequency signal line, and in the third region, the second insulating layer is between the ground line and the first insulating layer, a second conductive region is between the ground line and the upper surface of the insulating portion, and at least a second portion of the second insulating layer is between the second conductive region and the ground line.

* * * * *